United States Patent
Maharyta et al.

(10) Patent No.: US 10,558,313 B2
(45) Date of Patent: Feb. 11, 2020

(54) LOW POWER CAPACITIVE SENSOR BUTTON

(71) Applicant: Cypress Semiconductor Corporation, San Jose, CA (US)

(72) Inventors: Andriy Maharyta, Lviv (UA); Carl Liepold, San Jose, CA (US); Hans Klein, Pleasanton, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 16/159,418

(22) Filed: Oct. 12, 2018

(65) Prior Publication Data
US 2019/0158089 A1    May 23, 2019

Related U.S. Application Data

(63) Continuation of application No. 14/865,288, filed on Sep. 25, 2015, now Pat. No. 10,116,307, which is a
(Continued)

(51) Int. Cl.
*G06F 3/044* (2006.01)
*H03K 17/22* (2006.01)
(Continued)

(52) U.S. Cl.
CPC .......... *G06F 3/044* (2013.01); *H03K 17/22* (2013.01); *H03K 17/30* (2013.01); *H03K 17/962* (2013.01);
(Continued)

(58) Field of Classification Search
CPC ........ G06F 3/044; H03K 17/22; H03K 17/30; H03K 17/962; H03K 2217/960745;
(Continued)

(56) References Cited

U.S. PATENT DOCUMENTS 4,365,172 A    12/1982   Prater
4,785,435 A    11/1988   Inoue et al.
(Continued)

FOREIGN PATENT DOCUMENTS

CN    201163766 Y    12/2008
CN    102455823 A    5/2012
(Continued)

OTHER PUBLICATIONS

"CapSense Controllers", Cypress Semiconductor Corporation. Web. Dec. 30, 2014 <http://www.cypress.com/products/capsense-controllers>.
(Continued)

*Primary Examiner* — Premal R Patel

(57) ABSTRACT

Systems and methods receive multiple of trigger signals and responsive to each trigger signal transition a sensing block from operating in a first mode to operating in a second mode by turning on power to one or more portions of the sensing block. Operating in the second mode includes performing multiple sensor scans during multiple sensing periods of a monitoring period. Based on performing a first scan during a first sensing period, systems and methods transition from operating the sensing block in the second mode to operating the sensing block in the first mode by turning off the power to the one or more portions of the sensing block. Based on performing a second scan during a second sensing period, of the plurality of sensing periods, systems and methods transition a processing module from operating in a first processing mode to operating in a second processing mode.

20 Claims, 12 Drawing Sheets

Related U.S. Application Data continuation of application No. 14/667,434, filed on Mar. 24, 2015, now Pat. No. 9,176,636.

(60) Provisional application No. 62/067,347, filed on Oct. 22, 2014.

(51) Int. Cl.
*H03K 17/30* (2006.01)
*H03K 17/96* (2006.01)

(52) U.S. Cl.
CPC .............. *H03K 2217/96075* (2013.01); *H03K 2217/960745* (2013.01); *H03K 2217/960765* (2013.01); *H03K 2217/960775* (2013.01)

(58) Field of Classification Search
CPC ........ H03K 2217/96075; H03K 2217/960765; H03K 2217/960775
See application file for complete search history.

(56) References Cited

U.S. PATENT DOCUMENTS

| | | | |
|---|---|---|---|
| 8,058,937 B2 | 11/2011 | Qin et al. | |
| 8,144,126 B2 | 3/2012 | Wright | |
| 8,797,049 B2 | 8/2014 | Pedersen et al. | |
| 8,803,813 B2 | 8/2014 | XiaoPing et al. | |
| 2002/0075053 A1 | 6/2002 | Ganesan | |
| 2003/0101361 A1 | 5/2003 | Jain et al. | |
| 2004/0051396 A1 | 3/2004 | Supper et al. | |
| 2006/0240492 A1 | 10/2006 | Rusling et al. | |
| 2008/0272836 A1 | 11/2008 | Smit et al. | |
| 2010/0309171 A1* | 12/2010 | Hsieh | G06F 3/0416 345/204 |
| 2011/0000368 A1 | 1/2011 | Tollens | |
| 2011/0080367 A1 | 4/2011 | Marchand et al. | |
| 2011/0221452 A1 | 9/2011 | Shyue | |
| 2011/0264936 A1 | 10/2011 | Kamp | |
| 2012/0050216 A1* | 3/2012 | Kremin | G06F 3/0416 345/174 |
| 2012/0127124 A1* | 5/2012 | Zanone | G06F 1/3231 345/174 |
| 2012/0217982 A1 | 8/2012 | Narayanasamy et al. | |

FOREIGN PATENT DOCUMENTS

| | | |
|---|---|---|
| CN | 102541355 A | 7/2012 |
| CN | 202305754 U | 7/2012 |
| CN | 102999216 A | 3/2013 |
| WO | 2010056118 A1 | 5/2010 |
| WO | 2014083563 A2 | 6/2014 |

OTHER PUBLICATIONS

"MSP430G2x32 MSP430G2x02 Mixed Signal Microcontroller" May 2013, Texas Instruments, Dallas, TX.
"SX8634: Low Power, Capacitive Button and Slider touch Controller (12 Sensors) with Enhanced LED Drivers and Proximity Sensing" Revision 7_6, Oct. 2010, Semtech Corporation, Camarillo, CA.
International Search Report for International Application No. PCT/US2015/048993 dated Jan. 19, 2016; 2 pages.
Pushar Nandkar and Bala Satish Gurlinka, "Optimizing Performance Versus Power Consumption in Capacitive Touch Sensing Designs", Embedded.com, May 2011, Cypress Semiconductor Corporation, San Jose, CA.
Silicon Labs, "Sensing Multiple Channels in a Single Conversion; Low Power Capacitive Sensing", Rev 0.2, 2013; https://www.silabs.com/Support%20Documents/TechnicalDocs/AN507.pdf.
SIPO Office Action for Application No. 201580034994.1 dated Jan. 30, 2018; 4 pages.
SIPO Office Action for Application No. 201580034994.1 dated Jun. 7, 2018; 3 pages.
SIPO Office Action for International Application No. 201580034994.1 dated Aug. 2, 2017; 8 pages.
USPTO Advisory Action for U.S. Appl. No. 14/865,288 dated Jan. 29, 2018; 3 pages.
USPTO Final Rejection for U.S. Appl. No. 14/865,288 dated Nov. 17, 2017; 9 pages.
USPTO Non-Final Rejection for U.S. Appl. No. 14/865,288 dated Jul. 10, 2017; 19 pages.
USPTO Notice of Allowance for U.S. Appl. No. 14/667,434 dated Jun. 29, 2015; 10 pages.
USPTO Notice of Allowance for U.S. Appl. No. 14/865,288 dated Mar. 14, 2018; 5 pages.
USPTO Notice of Allowance for U.S. Appl. No. 14/865,288 dated Jul. 3, 2018, 5 pages.
USPTO Notice of Allowance for U.S. Appl. No. 14/865,288 dated Aug. 15, 2018, 2 pages.
Written Opinion of the International Searching Authority for International Application No. PCT/US2015/048993 dated Jan. 19, 2016; 11 pages.
China National Intellectual Property Administration Office Action for International Application No. 201910041263X dated Oct. 11, 2019, 7 pages.

\* cited by examiner

Without Touch

With Touch

LOW POWER CAPACITIVE SENSOR BUTTON

RELATED APPLICATIONS

This application is a continuation of U.S. patent application Ser. No. 14/865,288, filed on Sep. 25, 2015, which is a continuation of U.S. patent application Ser. No. 14/667,434, filed on Mar. 24, 2015, now U.S. Pat. No. 9,176,636, issued on Nov. 3, 2015, which claims priority to U.S. Provisional Application No. 62/067,347, filed on Oct. 22, 2014, all of which are incorporated by reference herein in their entirety.

TECHNICAL FIELD

This disclosure relates to the field of touch-sensors and, in particular, to capacitive touch-sensing buttons.

BACKGROUND

Many electronic devices include a user interface device for allowing user interaction and user input. One user interface device is a button or a key. Conventional buttons include mechanical components to actuate a switch to indicate a button press or button activation. Mechanical buttons also provide tactile feedback to the user to indicate the button has been pressed. More recently, touch-sensor buttons are being used in some applications to replace mechanical buttons.

One type of touch-sensor button operates by way of capacitance sensing, utilizing capacitance sensor electrodes. The capacitance detected by a capacitance sensor changes as a function of the proximity of a conductive object on or near the sensor electrode. The conductive object can be, for example, a stylus or a user's finger. In a touch-sensor button, a change in capacitance detected by each sensor due to the proximity of a conductive object can be measured by a variety of methods. Typically, an electrical signal representative of the capacitance detected by each capacitance sensor is processed by a processing device, which in turn produces electrical or optical signals representative of the button or sensor activation of the touch-sensor button.

However, mechanical buttons may still consume less power than capacitive sensor buttons because it is possible for mechanical buttons in the inactive state to not draw current, while still being responsive to input. In contrast, monitoring touch presence for existing capacitive sensor buttons may depend on the operation of various analog and digital circuits, thus increasing power demand even when the buttons are not being touched.

BRIEF DESCRIPTION OF THE DRAWINGS

The present disclosure is illustrated by way of example, and not by way of limitation, in the figures of the accompanying drawings.

DETAILED DESCRIPTION

Figure 1A:
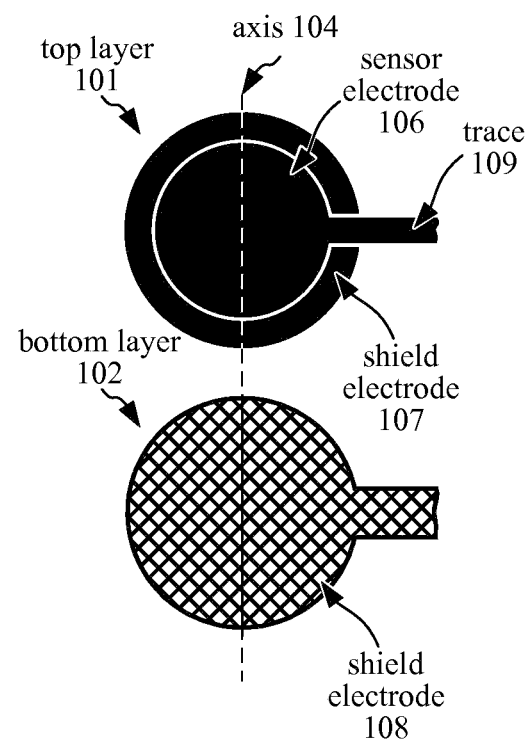
FIGS. 1A and 1B illustrate a capacitive sensor button, according to an embodiment.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

In one embodiment of a computing system having one or more capacitive sensor buttons, a capacitance sensing module of the computing system may operate in a state where the computing system is responsive to input via the one or more capacitive sensor buttons, while drawing an average steady state current that is no greater than 100 nanoamperes (nA). In this state, the capacitance sensing module monitors the one or more capacitive sensor buttons to detect any conductive object in contact with or in the proximity of any of the capacitive sensor buttons, and can respond to a detected touch by waking a processing unit from a low power consumption state to a high power consumption state. When operating in the high power consumption state, the processing unit consumes more power than in the low power consumption state. In one embodiment, the capacitance sensing module includes a low power oscillator that draws a minimal amount of current for the majority of the button monitoring period and a sensing circuit that periodically uses a greater amount of current for only a short period of time. The capacitance sensing module may thus be optimized for minimizing current consumption rather than for signal-to-noise ratio and scan rate.

The low power oscillator in the capacitance sensing module operates independently from other clock resources in the computing system, thus allowing the other clock resources to be turned off to reduce power demand, even while the capacitive sensor buttons are being monitored. In addition, the capacitance sensing module contains sufficient circuitry and touch-detection logic for detecting button touches without assistance from a central processing unit (CPU) of the computing system, thus allowing the CPU to be halted and transitioned to a low power consumption state during the button monitoring period.

In one embodiment, such a capacitance sensing module having a reduced power demand allows capacitive sensor buttons to be used in place of mechanical switches with minimal impact to the power demand imposed on the computing system. In particular, a low power capacitance sensing module may be used to implement capacitive sensor buttons in battery powered devices or other devices where low power consumption is desired.

Figure 1B:
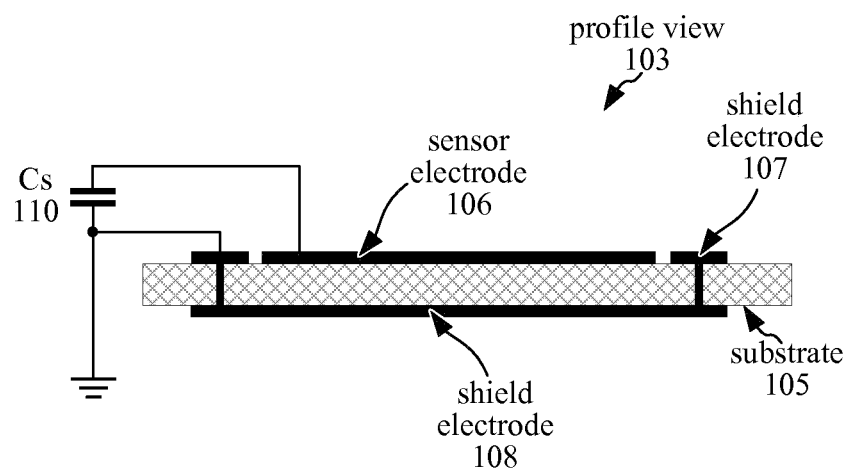

FIGS. 1A and 1B illustrate a first type of capacitive sensor button for measuring self-capacitance that may be used with a low power capacitance sensing module, according to an embodiment. FIG. 1A illustrates a top layer 101 and a bottom layer 102 of the self-capacitance sensor button, while FIG. 1B illustrates a profile section view 103 of the sensor button along axis 104. The self-capacitance sensor button as illustrated in FIGS. 1A and 1B includes the circular patterns of conductive material in the top layer 101 and the bottom layer 102 which are attached to the top and bottom surfaces of a substrate 105, respectively. The top layer 101 includes a sensor electrode 106 that is substantially surrounded by a shield electrode 107 and that is electrically connected to a connecting trace 109 that extends past the shield electrode 107 and can be used for connecting the sensor electrode 106 to sensing circuitry in the capacitance sensing module. The bottom layer 102 includes a shield electrode 108 having a cross-hatched fill pattern that overlaps the area covered by electrode 106, electrode 107, and trace 109. The shield electrode 108 is electrically connected to the shield electrode 107, and the shield electrodes 107 and 108 are grounded.

With reference to the profile view 103, the self-capacitance Cs 110 represents a capacitance between the sensor electrode 106 and the shield electrodes 107 and 108. In one embodiment, the capacitance Cs 110 is in the range from 3 picofarads (pF) to 5 pF, and changes by at least 1 pF when the button is touched by a conductive object such as a finger or stylus.

Figure 1C:
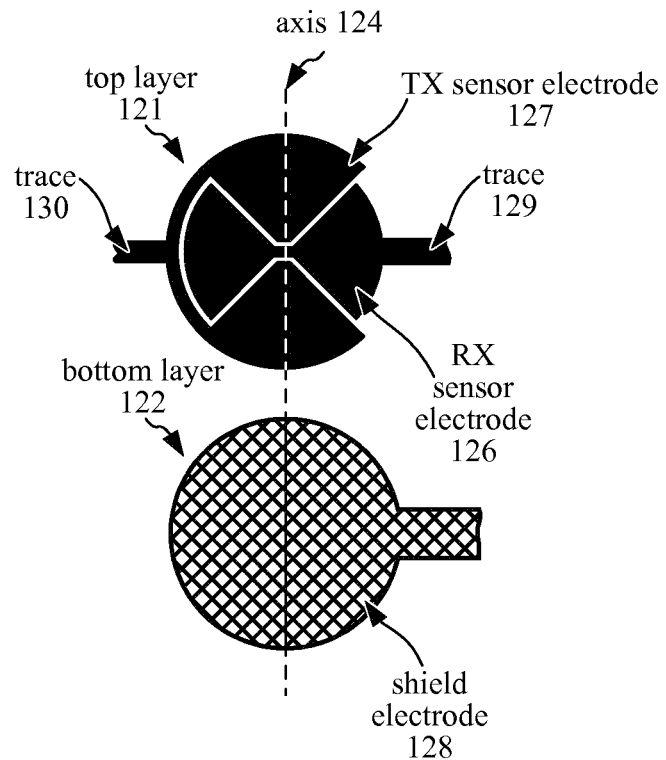
FIGS. 1C and 1D illustrate a capacitive sensor button, according to an embodiment.
Figure 1D:
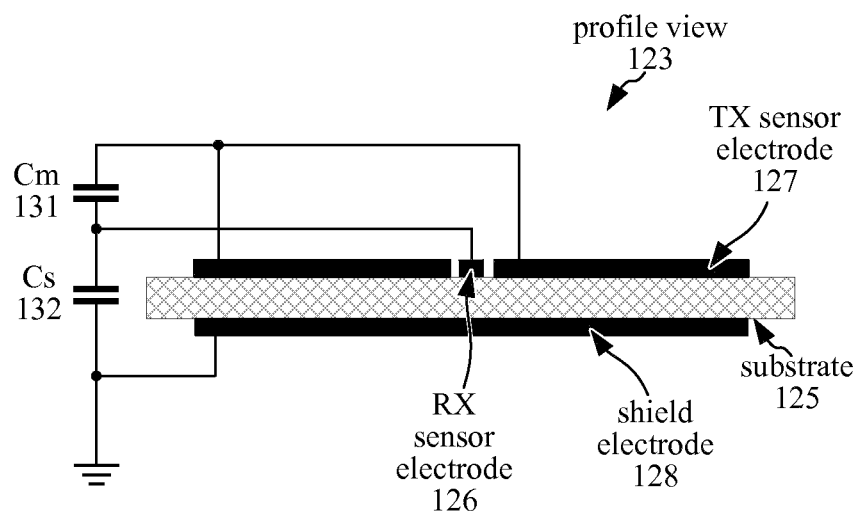

FIGS. 1C and 1D illustrate another type of capacitive sensor button for measuring mutual capacitance between two electrodes that may be used with a low power capacitance sensing module, according to an embodiment. FIG. 1C illustrates a top layer 121 and a bottom layer 122 of the mutual-capacitance sensor button, while FIG. 1D illustrates a profile section view 123 of the sensor button along axis 124. The mutual-capacitance sensor button as illustrated in FIGS. 1C and 1D includes the patterns of conductive material in the top layer 121 and the bottom layer 122 which are attached to the top and bottom surfaces of a substrate 125, respectively. The top layer 121 includes a receive (RX) sensor electrode 126 that is capacitively coupled with a transmit (TX) sensor electrode 127. The TX sensor electrode 127 and the RX sensor electrode 126 are extended by traces 130 and 129, respectively, which can be used as connection points to connect the electrodes 127 and 126 to sensing circuitry in the capacitance sensing module. The bottom layer 122 includes a shield electrode 128 that is connected to ground and that overlaps the area covered by the RX electrode 126, TX electrode 127, and trace 129 with a cross-hatched fill pattern.

With reference to the profile view 123, the mutual capacitance Cm 131 represents a capacitance between the TX sensor electrode 127 and the RX sensor electrode 126, while the self-capacitance Cs 132 represents a capacitance between the RX sensor electrode 126 and the grounded shield electrode 128. In one embodiment, the mutual capacitance Cm 131 decreases in response to a conductive object touching or in the proximity of the boundary between the TX electrode 127 and the RX sensor electrode 126, while the self-capacitance Cs 132 increases.

In some embodiments, capacitive sensor buttons as described above may be overlaid with a protective film, coating, or other material over the top layer of conductive material of the sensor button. For example, a layer of plastic or glass may be used to protect the conductive material from direct contact. Thus, the sensor button may detect a conductive object, such as a finger or stylus, that contacts the surface of the overlaid material rather than directly contacting the conductive material of the sensor button.

Figure 2A:
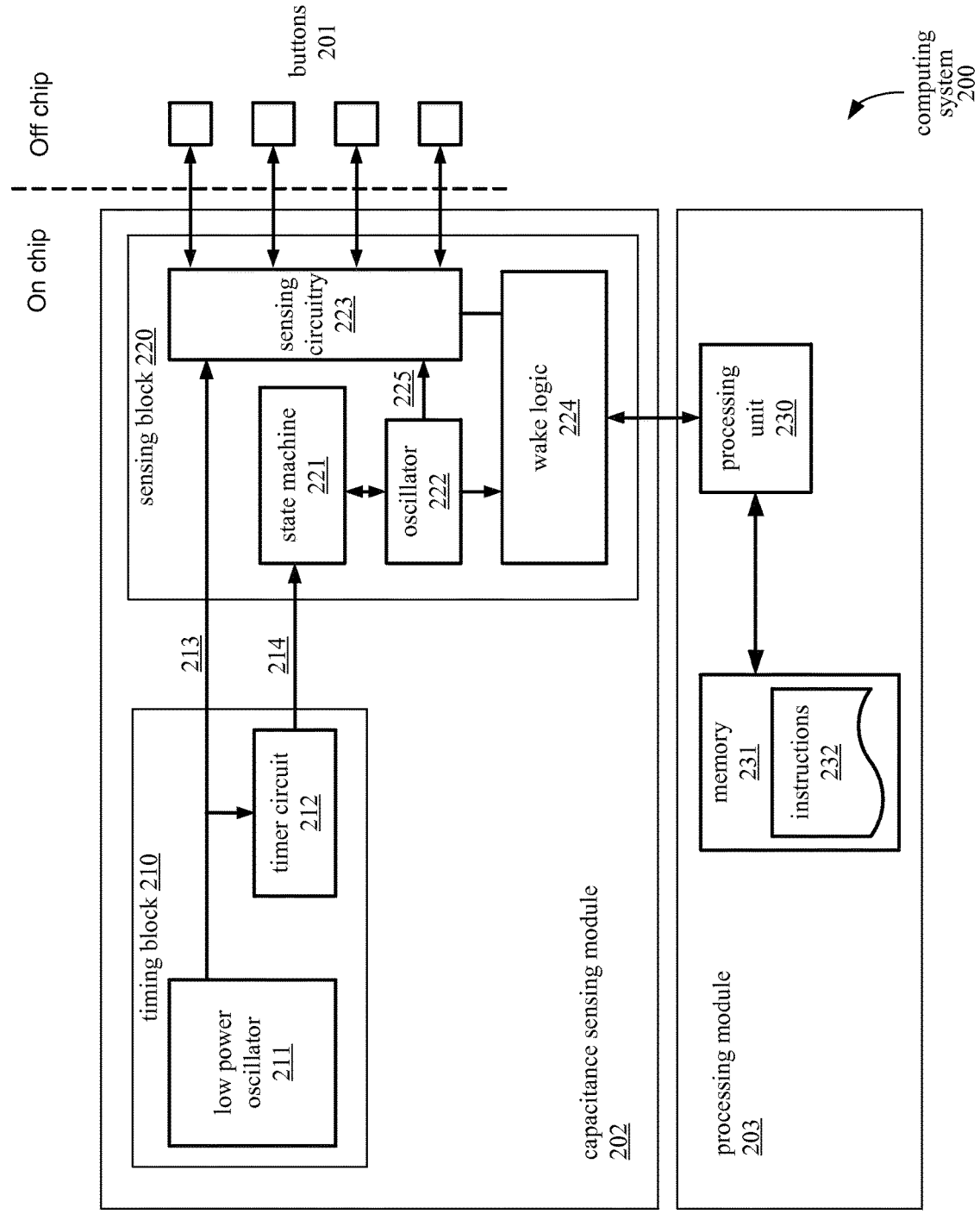
FIG. 2A is a block diagram illustrating an embodiment of a computing system that receives input via capacitive sensor buttons.

FIG. 2A illustrates a computing system 200, according to an embodiment. Computing system 200 includes capacitive sensor buttons 201, a capacitance sensing module 202, and a processing module 203. The capacitance sensing module 202 operates on a different power domain than the processing module 203, so that the capacitance sensing module 202 may be operated in different power consumption states independently from the power consumption state of the processing module 203. Accordingly, the capacitance sensing module 202 may be operating during a button monitoring period in order to monitor touches at the capacitive sensor buttons 201 even while the processing module 203 and/or the remainder of the computing system 200 is maintained in a low power consumption state, such as a suspend, standby, or hibernate state.

Figure 2B:
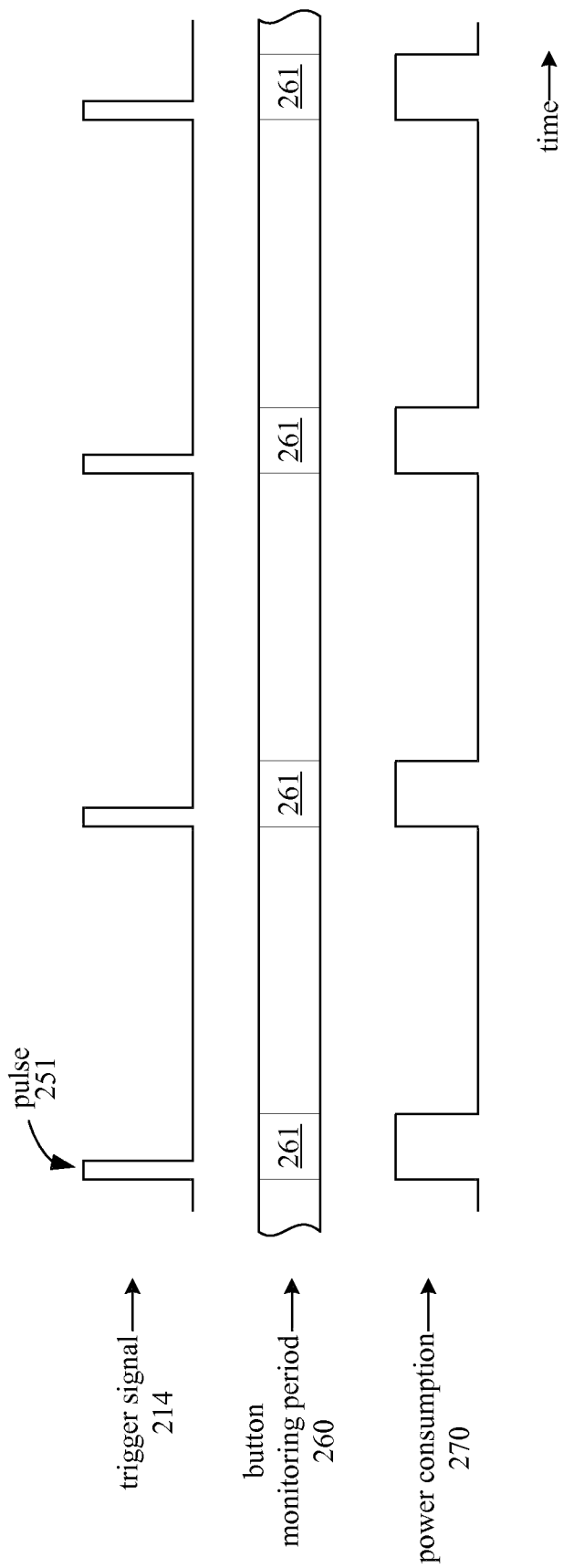
FIG. 2B is a timeline illustrating the operation of an embodiment of a computing system that receives input via capacitive sensor buttons.

In one embodiment, the capacitance sensing module 202 includes a timing block 210 and a sensing block 220. The timing block 210 includes a low power oscillator 211 and a timer circuit 212 that run continuously to repeatedly trigger the sensing block 220 to determine whether a contact is present at any of the buttons 201 (i.e., determine whether a conductive object is contacting or in the proximity of one of the buttons 201). FIG. 2B illustrates a timeline describing the operation of the timing block 210 and sensing block 220 during a button monitoring period 260, according to an embodiment, with time proceeding from left to right. As illustrated in FIG. 2B, the duration of the button monitoring period 260 includes repeated measurement periods 261 during which the sensing block 220 is determining whether a button is activated. The measurement periods 261 represent a relatively small percentage of the button monitoring period 260; thus, the operational duty cycle of the sensing block 220 is relatively low, and the sensing block 220 draws current for only a small percentage (e.g., 1%-10%) of the time during which the button 201 states are being monitored.

FIG. 2B also illustrates the power consumption 270 of the sensing block 220 during the button monitoring period 260. The power consumption 270 of the sensing block 220 is higher during the measurement period 261 and lower for the remainder of the button monitoring period 260 when no measurements are being performed. In one embodiment, a steady state current drawn by the sensing block 220 during a measurement period 261 is no more than 1 µA, and a steady state current drawn by the low power oscillator block is no more than 10 nA during the button monitoring period 260. In alternative embodiments, the steady state current drawn by the low power oscillator block may be up to 12 nA or more. In one embodiment, the total average steady state current drawn by the timer circuit, low power oscillator block, and the sensing block during the button monitoring period 260 is no more than 200 nA; in alternative embodiments, this total average steady state current may be greater than 200 nA. In one embodiment, this total average steady state current may be less than 100 nA.

In one embodiment, the low power oscillator 211 draws no more than approximately 10 nanoamperes (nA) and generates an clock signal 213 having a frequency that is no greater than 1 kilohertz (kHz). The low power oscillator 211 is connected to the timer circuit 212, and provides the 1 kHz clock signal 213 to the timer circuit 212. In alternative embodiments, the frequency of clock signal 213 may be greater or less than 1 kHz.

The timer circuit 212 receives the clock signal 213 from the low power oscillator 211 and generates a repetitive trigger signal 214 based on the clock signal 213. In one embodiment, the timer circuit may be implemented by a clock divider or a counter to generate a repetitive trigger signal 214 having a frequency that is less than the frequency of the clock signal 213. In one embodiment, the repetitive trigger signal 214 may be a pulse train having a frequency not greater than 1 Hertz (Hz). In one embodiment, the repetitive trigger signal 214 is a substantially periodic signal (i.e., having a fixed nominal period); in alternative embodiments, the repetitive trigger signal 214 may be aperiodic.

The timing block 210 transmits the clock signal 213 and the repetitive trigger signal 214 to the sensing block 220. In response to the repetitive trigger signal 214, the sensing block 220 initiates a measurement scan to determine whether a conductive object is in contact with any of the capacitive sensor buttons 201. For example, for a repetitive trigger signal 214 that is implemented as a pulse train, the sensing block 220 may initiate a measurement scan in response to each pulse in the pulse train, and may perform the measurement scan by sequentially applying one of the clock signals 213 or 225 to each of the capacitive sensor buttons 201 to measure their respective capacitance values during the measurement period. As illustrated in FIG. 2B, the pulse 251 of the trigger signal 214 initiates the first of the illustrated measurement periods 261 during which the sensor block 220 measures capacitance values from the capacitive sensor buttons 201.

The response of the sensing block 220 to the repetitive trigger signal 214 is controlled by the state machine 221, which receives the repetitive trigger signal 214 from the timer circuit 212. For example, the state machine 221 may respond to a pulse of the repetitive trigger signal 214 by transitioning the sensing block 220 from a low power consumption state to a high power consumption state. In one embodiment, the low power consumption state is an operating mode of the sensing block 220 in which the components of the sensing block 220, such as the oscillator 222, sensing circuitry 223, and wake logic 224 are not operating and are drawing no current or minimal current. The state machine 221 may thus transition the sensing block 220 to a high power consumption state by causing power to be supplied to the oscillator 222, sensing circuitry 223, and/or wake logic 224. By turning on these components of the sensing block 220, the state machine 221 causes the oscillator 222 to generate an clock signal 225 for the sensing circuitry 223, and causes the sensing circuitry 223 to begin measurement of the capacitive sensor buttons 201.

In one embodiment, the sensing circuitry 223 selects one of the clock signals 214 or 225 and applies the selected clock signal to each of the capacitive sensor buttons 201 in sequence to detect changes in capacitance resulting from a conductive object on or near any of the buttons 201. In one embodiment, the low power oscillator 211 consumes 10 nA of current to generate the clock signal 213 having a frequency of 1 kHz, while the oscillator 222 consumes 1 microampere (µA) to generate the clock signal 225 having a frequency of 100 kHz.

The use of clock signal 213 instead of clock signal 225 may result in relatively lower power consumption and an increased measurement period, corresponding to a slower response time for detecting a button contact. In one embodiment where only the 1 kHz clock signal 213 is used, the oscillator 222 may also be omitted or maintained in the off state for all power consumption states to further reduce power consumption. The use of clock signal 225 instead of clock signal 213 may result in relatively higher power consumption, a shorter measurement period, and a quicker response time for detecting a button contact.

In one embodiment, the state machine 221 is additionally configured to transition the sensing block 220 back to the low power consumption state after the measurement scan is complete and before a next subsequent pulse after the most recent pulse of the repetitive trigger signal 214.

The sensing block 220 includes a wake logic 224 which is configured to cause the processing unit 230 to transition from a low power consumption state to a high power consumption state in response to detecting the presence of the conductive object at the one or more of the capacitive sensor buttons 201. The wake logic 224 transition the processing module 203 from the low power consumption state to the higher power consumption state by outputting a wake signal to the processing unit 230. For example, wake logic 224 may transition the processing unit 230 from a low power consumption state that is an Advanced Configuration and Power Interface (ACPI) C3 'sleep' power state to a high power consumption state that is an ACPI C0 'operating' power state.

In one embodiment, the processing unit 230 and/or other components of the processing module 203 are supplied power from a different power domain than the capacitance sensing module 202. By operating the capacitance sensing module 202 and processing module 203 on different power domains, the modules 202 and 203 can be powered up and powered down independently, and can operate in different power consumption states. In one embodiment, the processing module 203 is constructed on a different integrated circuit chip than the capacitance sensing module 202. For example, a first integrated circuit chip that is supplied power from a first power domain may include the timing block 210 and sensing block 220, while a second integrated circuit chip that is supplied power from a second power domain may include the processing unit 230 and memory 231. In an alternative embodiment, the processing module 203 and the capacitance sensing module 202 can be located on the same integrated circuit chip.

In one embodiment, the wake logic 224 may determine whether a specific wake sequence has occurred, then output the wake signal to the processing module 203 in response to the wake sequence. A wake sequence may be defined as, for example, activation of a particular button or a combination or sequence of buttons. If a valid wake sequence is not detected, the wake logic 224 allows the processing unit 230 to remain in the low power consumption state.

In one embodiment, the wake signal output from the wake logic 224 may also cause the processing module 203 to transition between low and high power consumption states, since the processing module 203 may include other components (such as memory 231) that can be switched between power states. For example, the wake signal may switch the processing module 203 between one of the ACPI G1 'sleeping' power states and the ACPI G0 'working' power state. In one embodiment, the processing unit 230 may propagate the wake signal to the other components of processing module 203 in order to change the power consumption state of the processing module 203; alternatively, the wake signal may be received and processed by other logic in the processing module 203.

In one embodiment, the processing module 203 includes a memory 231 storing instructions 232 that are executable by the processing unit 230. In one embodiment, the processing unit 230 is configured to automatically execute the instructions 232 after transitioning from a low power consumption state to a high power consumption state. The processing unit 230 may execute different sets of instructions depending on the specific wake sequence that is detected by the wake logic 224. For example, when the sensing block 220 detects a contact at a first capacitive sensing button, the wake logic 224 may wake the processing unit 230 and cause the processing unit 230 to execute a first block of instructions, and when the sensing block 220 detects a contact at a second capacitive sensing button, the wake logic 224 may wake the processing unit 230 and cause the processing unit 230 to execute a different block of instructions.

Figure 3:
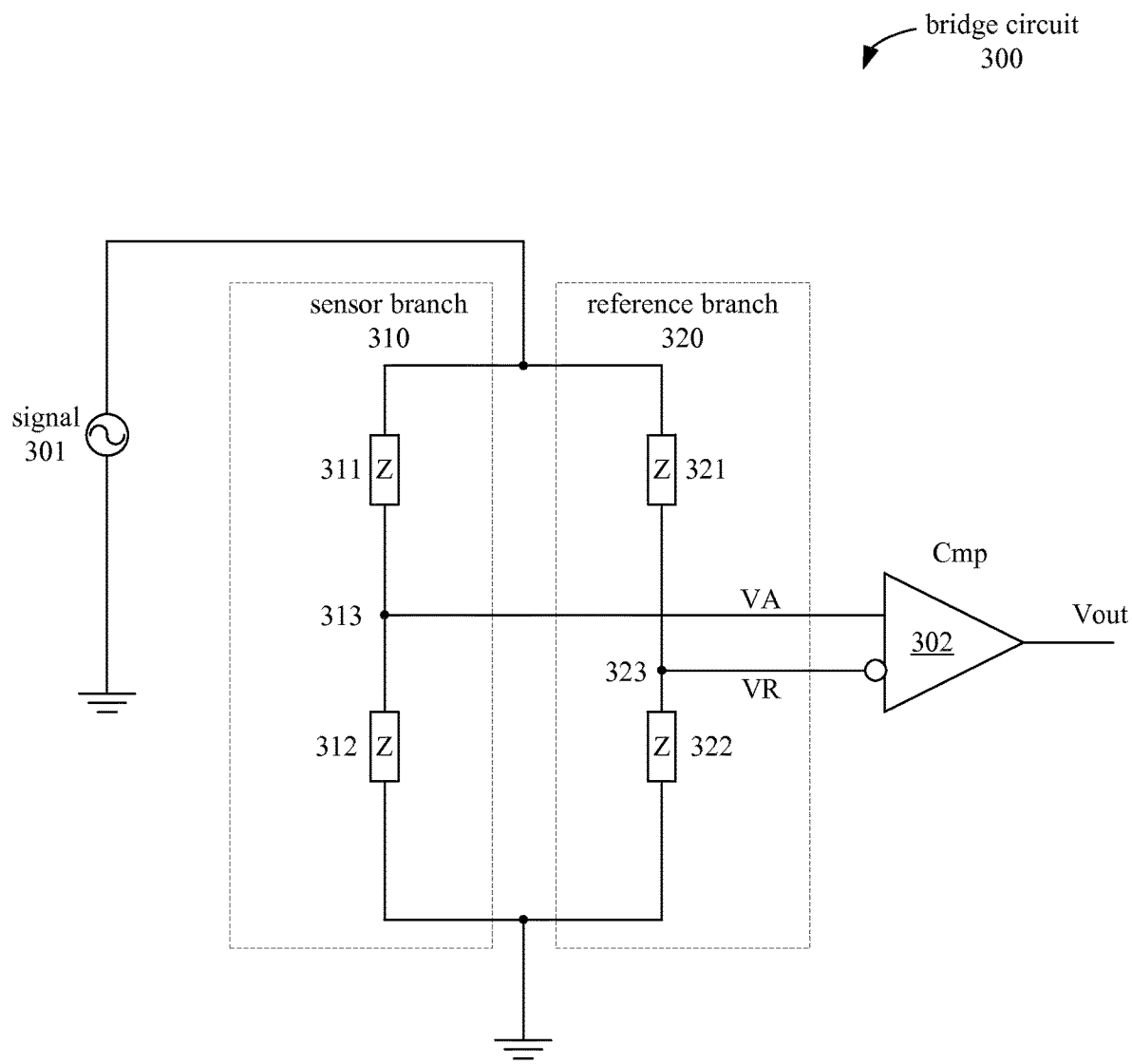
FIG. 3 illustrates an embodiment of a bridge circuit for detecting touches at a capacitive sensor button.

In one embodiment, the sensing circuitry 223 may be implemented using a bridge circuit 300, as illustrated in FIG. 3. The bridge circuit 300 includes a sensor branch 310 and a reference branch 320. Sensor branch 310 includes impedances 311 and 312 and reference branch 320 includes impedances 321 and 322. Node 313 between impedances 311 and 312 of the sensor branch 310 is connected to the positive input of comparator 302, and node 323 between impedances 321 and 322 of the reference branch is connected to the negative input of comparator 302.

In one embodiment, the impedances 321 and 322 of the reference branch 320 are programmable so that a ratio between the impedances 321 and 322 differs from a ratio between the impedances 311 and 312 of the sensor branch 310. For example, the impedances 321 and 322 may be programmed so that the reference branch and sensor branch ratios differ by between 5% and 10%.

In one embodiment, the reference impedances 321 and 322 may be implemented as programmable or adjustable impedances constructed on the same integrated circuit chip as the sensing circuitry 223. For example, the reference branch impedances 321 and 322 may be implemented using a set of switchable capacitors that can be adjusted in a firmware procedure when the processing unit 230 is active. Alternatively, the reference impedance 322 may be an external structure having similar characteristics as the capacitive sensor button.

According to the operation of the bridge circuit 300, the excitation signal 301 is applied to both the sensor branch 310 and the reference branch 320. In one embodiment, the excitation signal 301 is an alternating current (AC) signal that is generated by a digital logic unit based on one of the clock signals 213 or 225, and having the same frequency as the clock signal 213 or 225 from which it was derived. During the operation of the bridge circuit 300, a conductive object in contact with the capacitive sensor button affects the timing response of the sensor branch 310 such that the voltage polarity across the inputs of the comparator 302 is reversed. The output of comparator 302 thus indicates whether the capacitive sensor button has been touched.

Figure 4A:
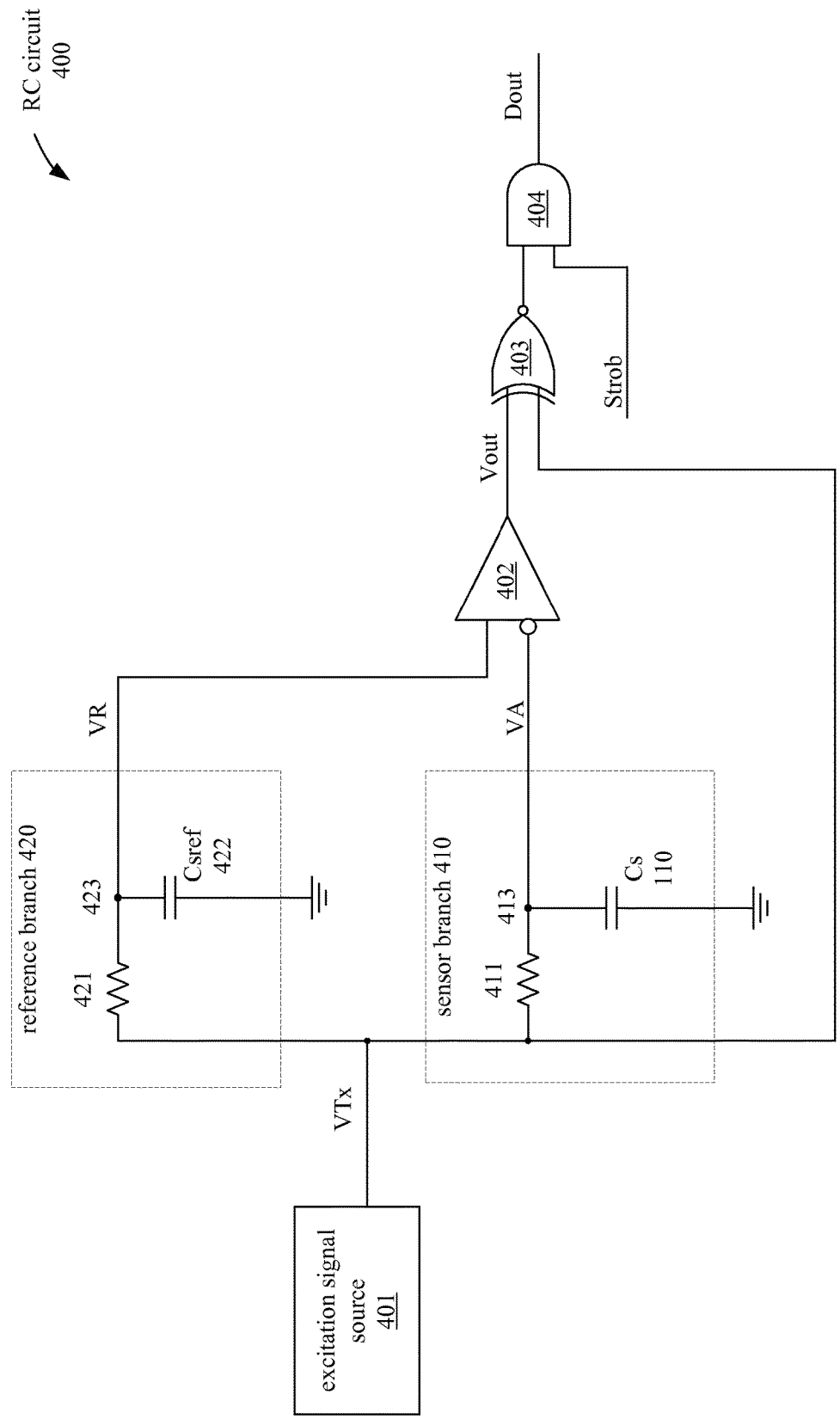
FIG. 4A illustrates an embodiment of a resistor-capacitor (RC) circuit for detecting touches at a capacitive sensor button.

In one embodiment, the bridge circuit 300 is implemented as a resistor-capacitor (RC) circuit as illustrated in FIG. 4A. The RC circuit 400 as illustrated in FIG. 4A may be used to detect changes in the self-capacitance of a capacitive sensor button due to the proximity or touch of a conductive object. With reference to FIG. 1B, for example, node 413 of circuit 400 can be electrically coupled with the sensor electrode 106 in order to detect changes in Cs 110.

The RC circuit 400 includes a reference branch 420, including a resistance 421 connected by a node 423 to a reference capacitance 422. These correspond respectively to the reference branch 320, impedance 321, node 323, and impedance 322 in the bridge circuit 300. The RC circuit 400 also includes a sensor branch 410, including a resistance 411 connected by node 413 to the sensor capacitance 110, which correspond respectively to the sensor branch 310, impedance 311, node 313, and impedance 312 of the bridge circuit 300.

According to the operation of the RC circuit 400, the excitation signal source 401 generates an excitation signal VTx, which is applied to both the reference branch 420 and the sensor branch 410. The voltages VR and VA from nodes 423 and 413 are connected to the positive and negative inputs of the comparator 402, respectively. The time constant of the sensor branch 410 changes in response to the presence of a conductive object contacting or in the proximity of the capacitive sensor button, and the voltage polarity at the inputs of comparator 402 is reversed, relative to when the button is not being touched.

Figure 4B:
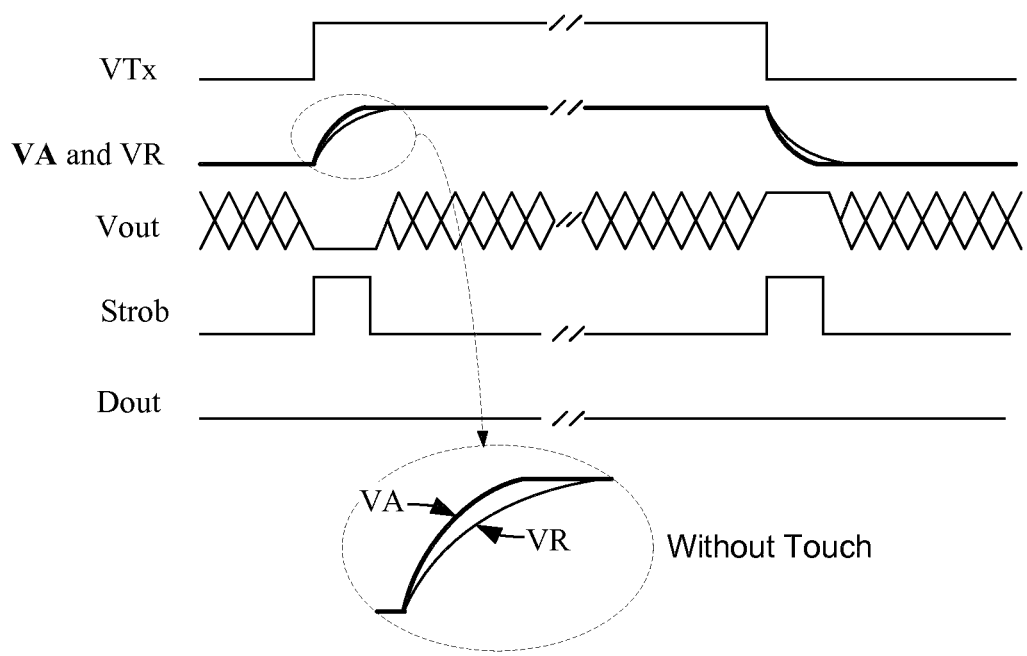
FIGS. 4B and 4C illustrate voltage waveforms for a resistor-capacitor (RC) circuit for detecting touches at a capacitive sensor button, according to an embodiment.
Figure 4C:
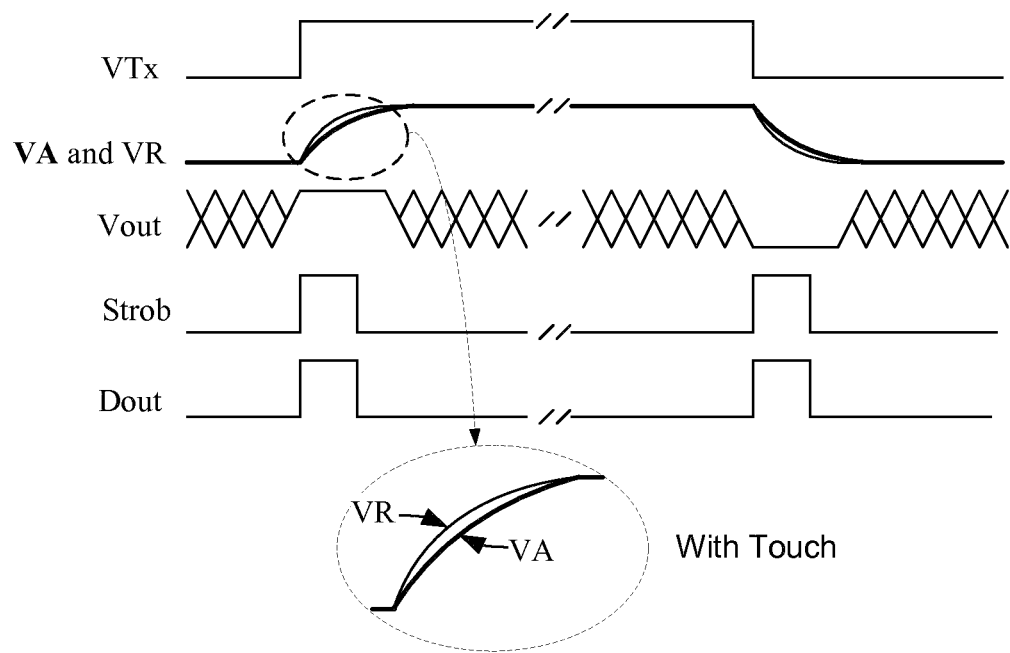

The XNOR gate 403 asserts its output when the comparator 402 output Vout and the excitation signal VTx are both asserted or both deasserted. The output of the XNOR gate 403 is then sampled by the Strob signal via AND gate 404. The output Dout of AND gate 404 is a train of positive pulses when a touch is detected, and is a constant low voltage when no touch is detected. FIG. 4B illustrates the voltages VTx, VA, VR, Strob, and Dout of RC circuit 400 when no touch is detected at the capacitive sensor button, and FIG. 4C illustrates the same voltages when a touch is detected.

Figure 5A:
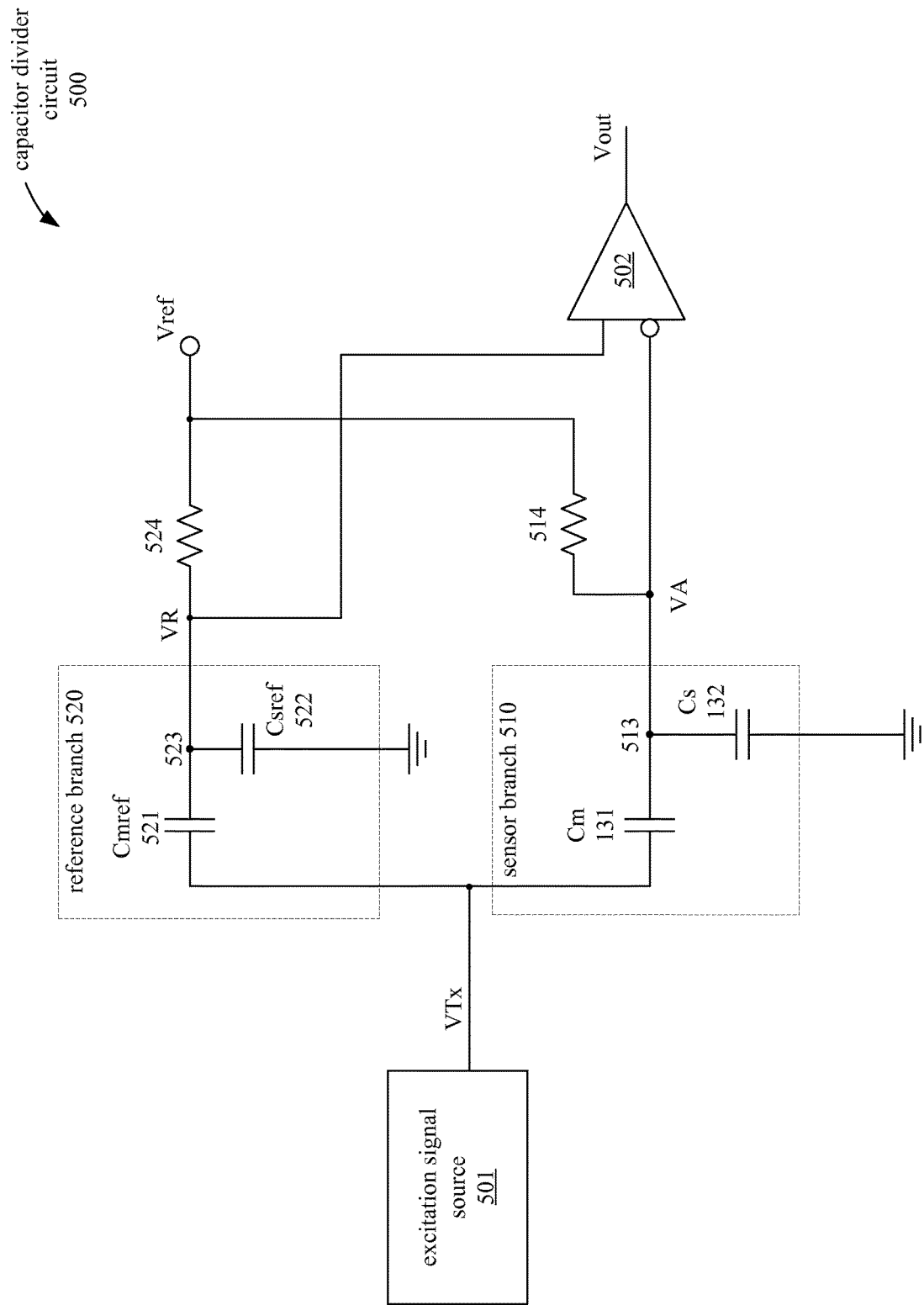
FIG. 5A illustrates an embodiment of a capacitor divider circuit for detecting touches at a capacitive sensor button.

In one embodiment, the bridge circuit 300 is implemented as a capacitor divider circuit as illustrated in FIG. 5A. The capacitor divider circuit 500 includes a reference branch 520, including capacitances 521 and 522 connected together at node 523. These correspond respectively to the reference branch 320, impedance 321, impedance 322, and node 323 in the bridge circuit 300. The capacitor divider circuit 500 also includes a sensor branch 510, including capacitances 131 and 132 connected together at node 513, which correspond respectively to the sensor branch 310, impedance 311, impedance 312, and node 313 of the bridge circuit 300.

The capacitor divider circuit 500 as illustrated in FIG. 5A may be used to detect changes in the mutual capacitance and self-capacitance of a capacitive sensor button due to the proximity or touch of a conductive object. With reference to FIGS. 5A and 1D, for example, the excitation signal generator 501 can apply the excitation signal VTx to the TX sensor electrode 127 while node 513 of circuit 500 is electrically coupled with the RX sensor electrode 126 in order to detect changes in Cm 131 and Cs 132.

Resistors 524 and 514 connect nodes 523 and 513, respectively, to a reference voltage Vref to initialize and maintain the voltages VR and VA within the operating range of the comparator 502. The voltages VR and VA are applied to the positive and negative inputs of comparator 502. While the excitation signal source 501 applies the excitation signal VTx to the sensor branch 510 and the reference branch 520, a conductive object contacting the capacitive sensor button decreases Cm 131 and increases Cs 132. As a result, the voltage polarity at the inputs of comparator 502 is reversed, relative to when the button is not being contacted. The comparator 502 output voltage Vout thus indicates whether or not a conductive object is touching or in proximity to the capacitive sensor button. A Vout signal indicating a button touch may be converted to a pulse train using an XNOR gate and an AND gate, similar to the XNOR gate 403 and AND gate 404 in RC circuit 400.

Figure 5B:
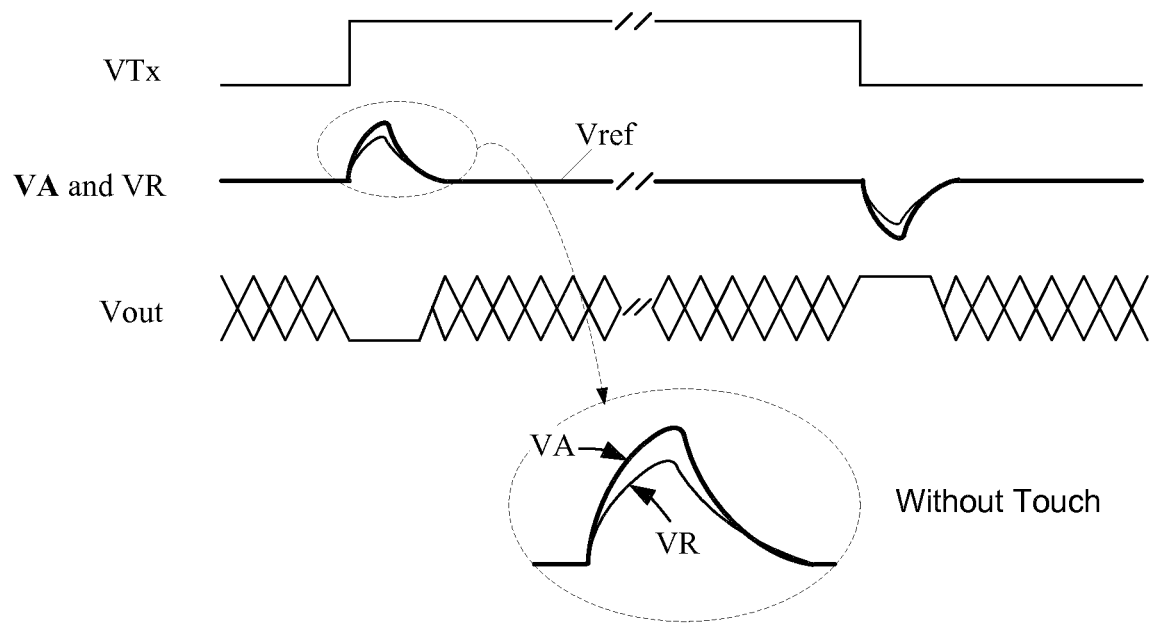
FIGS. 5B and 5C illustrate voltage waveforms for a capacitor divider circuit for detecting touches at a capacitive sensor button, according to an embodiment.
Figure 5C:
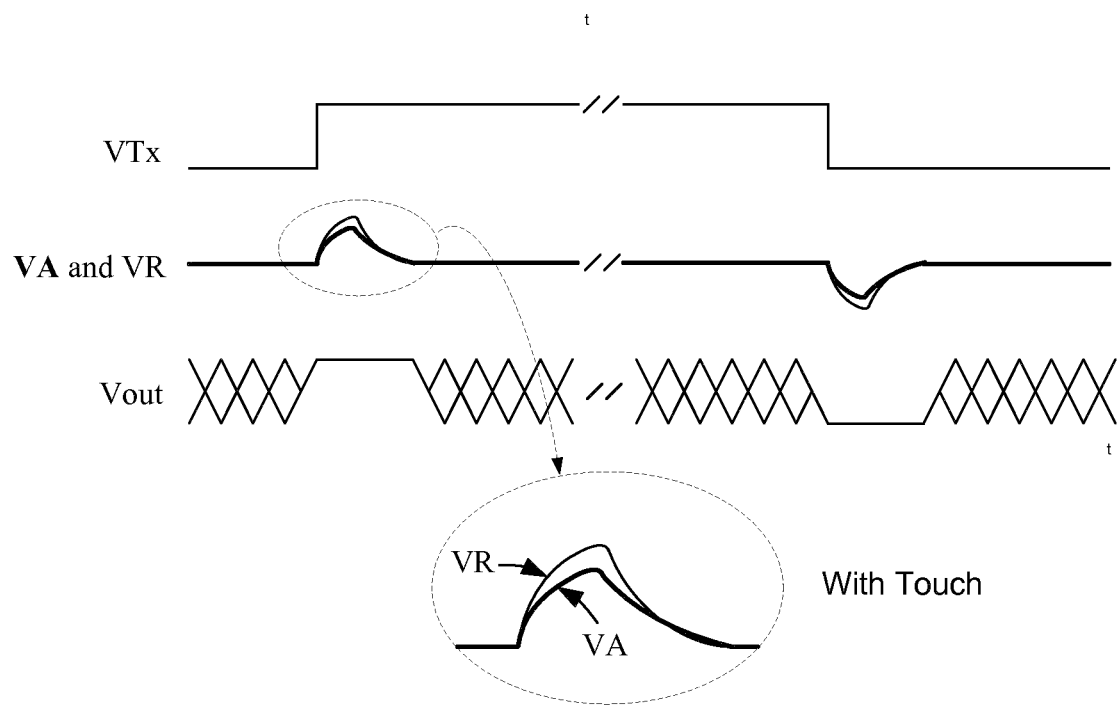

FIG. 5B illustrates the voltages VTx, VA, VR, Strob, and Dout of the capacitor divider circuit 500 when no touch is detected at the capacitive sensor button, and FIG. 5C illustrates the same voltages when a touch is detected.

Figure 6A:
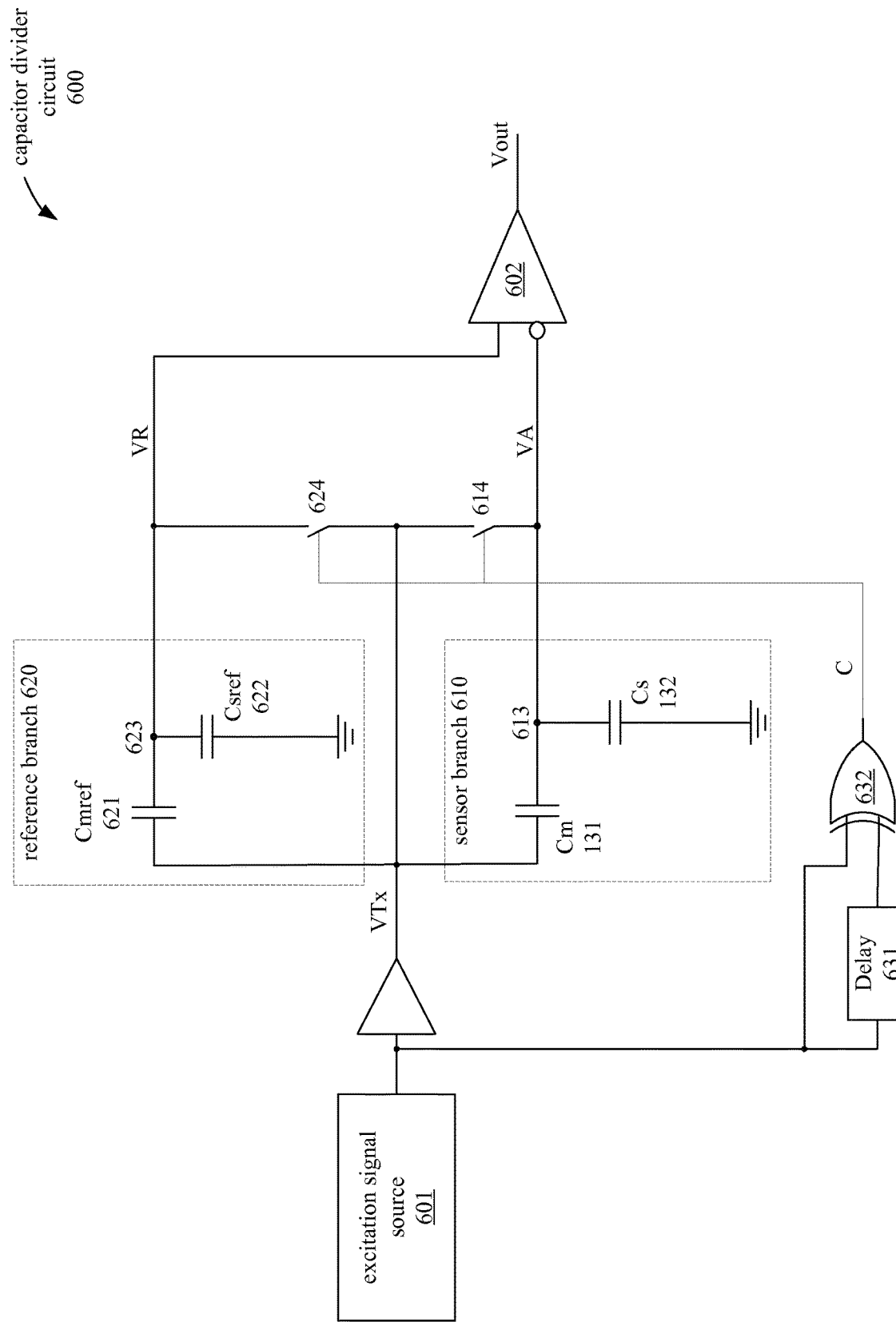
FIG. 6A illustrates an embodiment of a capacitor divider circuit for detecting touches at a capacitive sensor button without a reference voltage.

FIG. 6A illustrates an embodiment of a capacitor divider circuit 600. Similar to circuit 500, the capacitor divider circuit 600 operates by applying an excitation signal VTx to a reference branch 620 and a sensor branch 610, then comparing the voltages VR and VA at nodes 623 and 613, respectively, using a comparator 602. However, the capacitor divider circuit 600 consumes less power than circuit 500 by eliminating the reference voltage Vref and resistors 524 and 514.

Without the resistors 524 and 514, the capacitor divider circuit 600 initializes and maintains the voltages VR and VA within the operating range of the comparator 602 using switches 624 and 614. The switches 624 and 614 are closed during an initialization stage of the detection process and are open during a measurement stage of the detection process. During the initialization stage, nodes 623 and 613 are connected together to eliminate any voltage difference between VR and VA.

The switches 624 and 614 are operated by a control signal C, which is generated from a gate 632 performing an XOR operation on the excitation signal and a delayed version (via delay 631) of the excitation signal. This results in a signal C that resembles an inverted pulse train, with the falling edge of each pulse substantially coinciding with the rising edge of the excitation signal VTx, and with the pulse width determined by the duration of the delay 631.

Figure 6B:
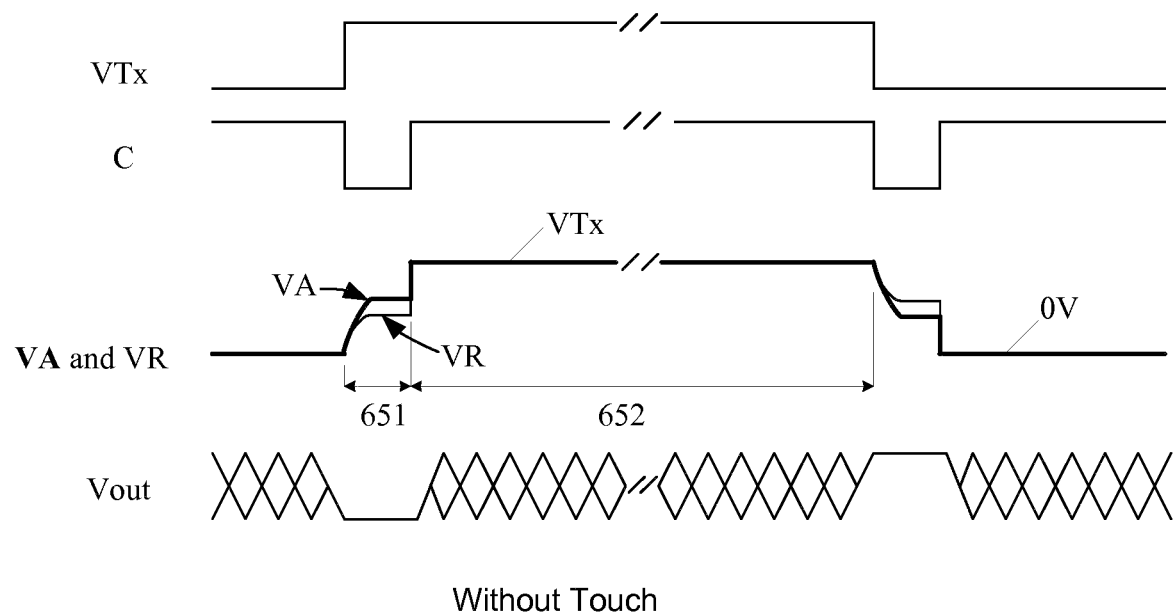
FIGS. 6B and 6C illustrate voltage waveforms for a capacitor divider circuit for detecting touches at a capacitive sensor button without a voltage reference, according to an embodiment.
Figure 6C:
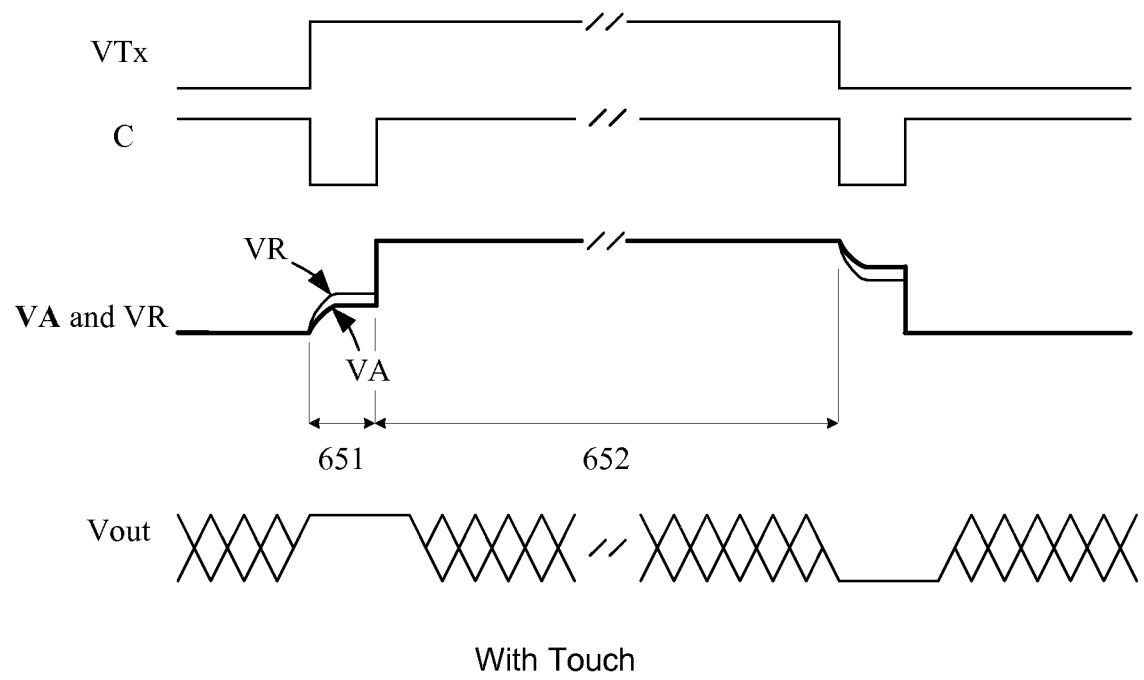

FIGS. 6B and 6C illustrate voltage waveforms for the circuit 600 when a touch is not present and when a touch is present at the capacitive sensor button, respectively. As illustrated in FIG. 6B, the initialization stage 652 corresponds to the time when the switches 624 and 614 are closed by the control signal C and the difference between VR and VA is reduced to 0V. The measurement stage 651 corresponds to the time when the switches 624 and 614 are opened by the control signal C.

During the measurement stage 651, the sign of the difference between VR and VA is determined by the whether a conductive object is in contact with or in the proximity of the capacitive sensor button. Thus, the comparator 602 output Vout indicates whether the capacitive sensor button has been contacted. A Vout signal indicating a button touch may be converted to a pulse train using an XNOR gate and an AND gate, similar to the XNOR gate 403 and AND gate 404 in RC circuit 400.

Figure 7:
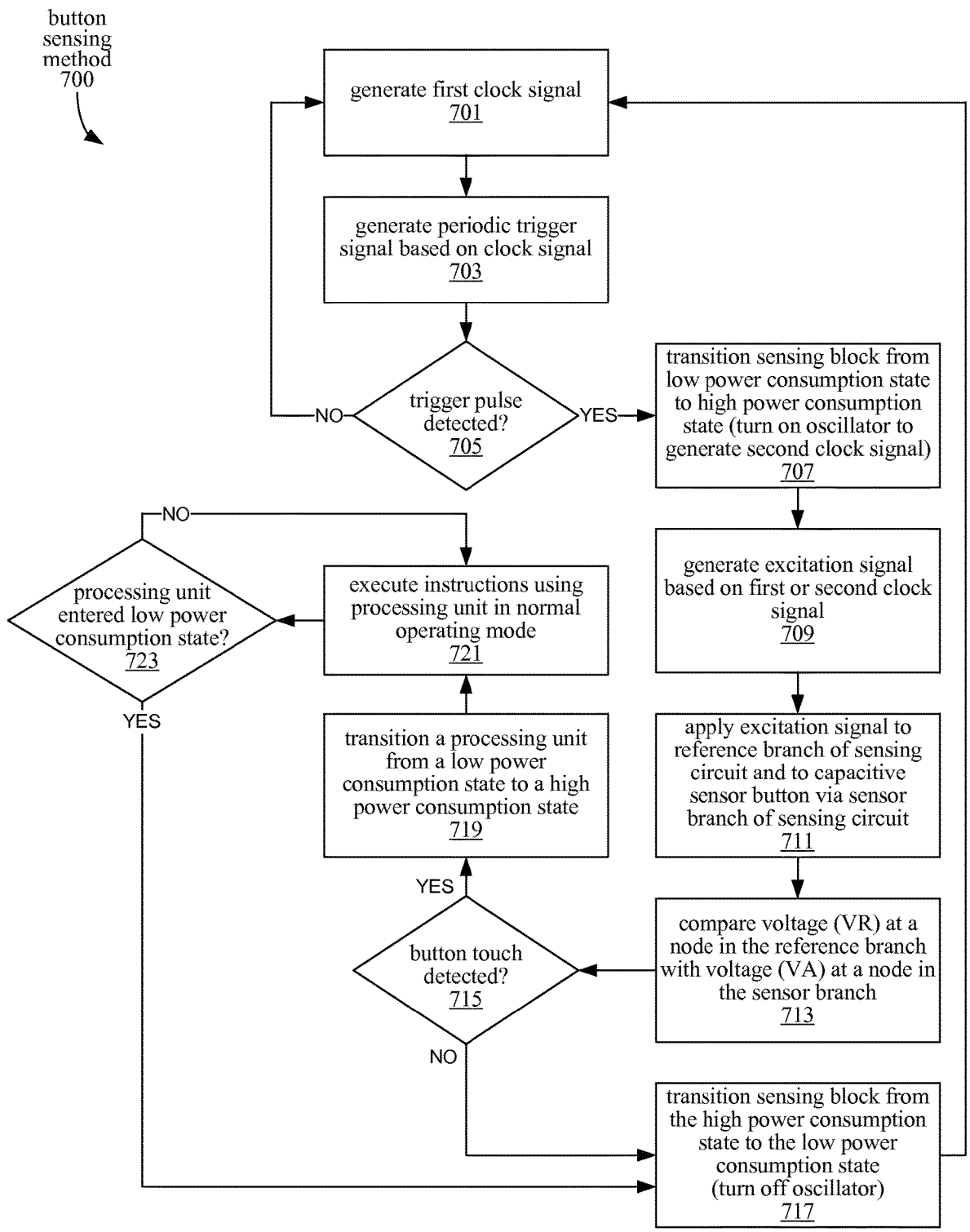
FIG. 7 is a flow diagram illustrating a process of detecting touches at one or more capacitive sensor buttons in a computing system, according to an embodiment.

FIG. 7 is a flow diagram illustrating an embodiment of a button sensing process 700. Process 700 may be performed by the computing system 200, including the components of the capacitance sensing module 202 and the processing module 203.

Process 700 begins at block 701. At block 701, the low power oscillator 211 generates the clock signal 213 and supplies the clock signal 213 to the timer circuit 212 and the sensing block 220. From block 701, the process 700 continues at block 703.

At block 703, the timer circuit 212 receives the clock signal 213 and generates the repetitive trigger signal 214 having a lower frequency than the clock signal 213. In one embodiment, the repetitive trigger signal 214 is a pulse train. The repetitive trigger signal 204 is provided to the state machine 221 in sensing block 220. From block 703, the process 700 continues at block 705.

At block 705, the state machine monitors the repetitive trigger signal 204 for at least the duration of the button monitoring period that does not coincide with a measurement period. The operations of blocks 701 and 703 are also continued for the duration of the button monitoring period. The process 700 does not continue to the next block 707 until the state machine 221 detects a trigger pulse in the repetitive trigger signal 214.

In response to the trigger pulse of the repetitive trigger signal 214, the sensing block detects the presence of a conductive object at a capacitive sensor button (e.g., one of the capacitive sensor buttons 201) by applying an excitation signal VTx to the capacitive sensor button. Thus, the detection of the trigger pulse by the state machine 221 initiates a measurement period.

The measurement period begins at block 707, when the state machine 221 transitions the sensing block 220 from a low power consumption state to a high power consumption state. In one embodiment, the state machine 221 performs this transition by supplying power or otherwise enabling the components of the sensing block 220, such as the sensing circuitry 223, and wake logic 224. In embodiments that include oscillator 222, transitioning to a high power state also includes enabling oscillator 222, allowing the oscillator 222 to draw current and generate clock signal 225. From block 707, the process 700 continues at block 709.

At block 709, the sensing circuitry 223 generates an excitation signal VTx based on clock signal 213 or, in embodiments including an oscillator 222, clock signal 225. The excitation signal may be generated within the sensing circuitry 223 by an excitation signal source such as excitation signal source 401, 501, or 601. In one embodiment, the generated excitation signal VTx has the same frequency as the clock signal 213 or 225 from which it is generated. From block 709, the process 700 continues at block 711.

At block 711, the excitation signal source applies the generated excitation signal VTx to a reference branch (such as reference branch 420, 520, or 620) and to a capacitive sensor button via a sensor branch (such as sensor branch 410, 510, or 610) of the sensing circuit 223. From block 711, the process 700 continues at block 713.

At block 713, a comparator of the sensing circuit 223 compares a voltage VR from a node of the reference branch with a voltage VA from a node of the sensor branch. With reference to FIG. 4A, for example, the comparator 402 compares the voltage VR from node 423 with the voltage VA from node 413. Similarly, comparators 502 and 602 compare the voltages from reference branch nodes 523 and 623 with voltages from sensor branch nodes 510 and 610, respectively, in FIGS. 5A and 6A. The comparator output thus indicates whether or not a conductive object is contacting or in close proximity to the capacitive sensor button. In one embodiment, blocks 709, 711, and 713 may be repeated to sense multiple capacitive sensor buttons. From block 713, the process 700 continues at block 715.

At block 715, the wake logic 224 determines based on the sensing circuit 223 output Vout or Dout whether or not the capacitive sensor button has been contacted. In embodiments where more than one button is sensed, the wake logic 224 may determine whether a valid wake sequence has been performed, such as activation of a specific button or specific sequence of buttons. At block 715, if no button contact or valid wake sequence has been detected, the process 700 continues to block 717. In some embodiments, the process 700 may repeat blocks 709-715 for multiple iterations prior to continuing at block 717, in order to detect button touches over a longer measurement period.

At block 717, the state machine 221 transitions the sensing block 220 from the high power consumption state to the low power consumption state. The state machine 221 may transition the sensing block 220 to the low power consumption state by turning off (e.g., disconnecting power from or otherwise disabling) the components of the sensing block 220, such as the sensing circuitry 223 and wake logic 224. In embodiments that include oscillator 222, the transition to the low power consumption state may also include turning off the oscillator 222, ceasing the generation of clock signal 225. In one embodiment, the duration of the measurement period is less than the period between trigger pulses of the repetitive trigger signal 214. Accordingly, the transition of the sensing block 220 to the low power consumption state occurs after the measurement period and before a next subsequent pulse of the repetitive trigger signal after the pulse of the repetitive trigger signal that initiated the most recent measurement period.

If, at block 715, a button touch or valid wake sequence is detected, the process 700 continues at block 719. At block 719, the wake logic 224 transmits a wake signal to the processing unit 230, causing the processing unit 230 to transition from a low power consumption state to a high power consumption state. In one embodiment, the processing unit 230 is maintained in a low power consumption state, (e.g., an ACPI C3 'sleep' power state) during the button monitoring period. In response to receiving the wake signal from the wake logic 224, the processing unit 230 transitions to a high power consumption state (e.g., an ACPI C0 'operating' power state). In one embodiment, the wake logic 224 also causes other components in the processing module 203 to transition from a low power consumption state to a high power consumption state in response to a button touch or wake sequence. From block 719, the process 700 continues at block 721.

At block 721, the processing unit 230 operates normally in the high power consumption state, and may execute instructions 232 retrieved from memory 231. In one embodiment, instructions 232 may define one or more applications that operate based on input received from the capacitive sensor buttons. From block 721, the process 700 continues at block 723.

At block 723, the wake logic 224 determines whether the processing unit 230 has transitioned back to the low power consumption state. If the processing unit 230 is not in the low power consumption state, the process 700 continues back to block 721. The processing unit 230 thus continues to function in the normal operating mode until it is transitioned to the low power consumption state by a user, time delay, or some other system process. If, at block 723, the processing unit 230 is in the low power consumption state, the process 700 continues to block 717.

At block 717, the state machine 221 transitions the sensing block 220 from a high power consumption state to a low power consumption state. As illustrated in FIG. 7, the sensing block 220 thus remains in a high power consumption state in order to continue monitoring for contacts at the capacitive sensor buttons while the processing unit 230 is operating normally in the high power consumption state according to block 721. After the processing unit 230 is transitioned back to the low power consumption state, the button monitoring period begins and the sensing block 220 also transitions to a low power consumption state. The sensing block 220 remains in this low power consumption state until the next measurement period is triggered by the next trigger pulse of the repetitive trigger signal 214.

In an alternative embodiment, the sensing block 220 may be kept in a low power consumption state during normal high power consumption operation of the processing unit 230. According to such an embodiment, the sensing block 220 can be transitioned to the low power consumption state after a button touch or valid wake sequence is detected at block 715.

In the foregoing embodiments, various modifications can be made; for example, TX sensor electrodes and RX sensor electrodes may be interchanged, and physical features of the electrodes may be altered relative to the illustrated embodiments. As described herein, a "contact" or "touch" of a capacitive sensor may refer to any contact or presence of an object that is sufficiently near the sensor to have an effect on the capacitance that is measurable by the described capacitance sensing devices or circuitry. As described herein, conductive electrodes that are "electrically connected" or "electrically coupled" may be coupled such that a relatively low resistance conductive path exists between the conductive electrodes. The terms "substantially" and "approximately" may indicate values or characteristics that may deviate from a nominal value or ideal characteristic (where such deviation may result from manufacturing tolerances, rounding error, and the like) while the desired effect of the nominal value or ideal characteristic is preserved.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
   operating a sensing block in a first mode and a second mode during a sensor monitoring period;
   receiving a plurality of trigger signals;
   responsive to each trigger signal, of the plurality of trigger signals, transitioning the sensing block from operating in the first mode to operating in the second mode, said transitioning comprising turning on power to one or more portions of the sensing block;
   operating the sensing block in the second mode, said operating comprising performing a plurality of sensor scans during a plurality of sensing periods of the monitoring period;
   based on performing a first scan during a first sensing period, of the plurality of sensing periods, transitioning from operating the sensing block in the second mode to operating the sensing block in the first mode, said transitioning comprising turning off the power to the one or more portions of the sensing block; and
   based on performing a second scan during a second sensing period, of the plurality of sensing periods, transitioning a processing module from operating in a first processing mode to operating in a second processing mode.

2. The method of claim 1, wherein the operating of the sensing block in the first mode comprises operating the sensing block in the first mode during a plurality of non-sensing periods of the sensor monitoring period.

3. The method of claim 1, wherein the operating of the sensing block in the second mode comprises operating the sensing block in the second mode according to a duty cycle that is based on a frequency of the plurality of trigger signals.

4. The method of claim 1, wherein the operating of the sensing block in the second mode comprises 1%40% of the sensor monitoring period.

5. The method of claim 1, wherein performing the plurality of sensor scans during the plurality of sensing periods comprises generating at least one excitation signal for each sensor scan, wherein a frequency of the at least one excitation signal is greater than a frequency of the trigger signal.

6. The method of claim 5, wherein the trigger signal and the at least one excitation signal are based on a same clock signal.

7. The method of claim 1, wherein the turning on the power to the one or more portions of the sensing block comprises causing the power to be supplied to at least one of sensing circuitry and wake logic.

8. The method of claim 1, wherein the transitioning from operating the sensing block in the second mode to operating the sensing block in the first mode includes an absence of an object proximate to a sensor.

9. The method of claim 1, wherein the transitioning of the processing module from operating in the first processing mode to operating in the second processing mode is responsive to detecting a presence of an object proximate to a sensor, based on the performing of the second scan.

10. The method of claim 1, wherein performing the plurality of sensor scans during the plurality of sensing periods comprises scanning one or more capacitive sensors to detect a presence of a conductive object.

11. A capacitive sensing module comprising:
    sensing circuitry configured to couple to one or more capacitive sensors, the sensing circuitry configured to operate in a first mode and a second mode during a sensor monitoring period, wherein the operation of the sensing circuitry in the first mode comprises a plurality of non-sensing periods of the sensor monitoring period and the operation of the sensing circuitry in the second mode comprises a plurality of sensor scans during a plurality of sensing periods of the sensor monitoring period; and
    first logic coupled to the sensing circuitry, the first logic configured to receive a plurality of trigger signals and responsive to each trigger signal transition the sensing circuitry from operation in the first mode to operation in the second mode, the transition comprising turning on power to the sensing circuitry, wherein responsive to a first sensor scan of a first sensing period, the first logic is configured to transition the sensing circuitry from operation in the second mode to operation in the first mode, the transition comprising turning off the power to the sensing circuitry; and
    second logic coupled to the sensing circuitry, wherein responsive to a second scan during a second sensing period the second logic is configured to transition a processing module from operation in a first processing mode to operation in a second processing mode.

12. The capacitive sensing module of claim 11, wherein the sensing circuitry is configured to operate in the second mode according to a duty cycle that is based on a frequency of the plurality of trigger signals.

13. The capacitive sensing module of claim 11, wherein the sensing circuitry is configured to generate at least one excitation signal for each sensor scan, of the plurality of sensor scans, wherein a frequency of the at least one excitation signal is greater than a frequency of the plurality of trigger signals.

14. The capacitive sensing module of claim 13, further comprising:
    an oscillator configured to generate a clock signal, wherein the frequency of the at least one excitation signal for each sensor scan is based on the frequency of the clock signal; and
    timer circuit configured to generate the plurality of trigger signals.

15. The capacitive sensing module of claim 14, wherein the timer circuit is coupled to the oscillator, wherein the timer circuit is configured to generate the plurality of trigger signals based on the clock signal generated by the oscillator.

16. An integrated circuit, comprising:
    a sensing block to couple with one or more capacitive sensors, the sensing block to operate in a first mode and a second mode during a sensor monitoring period, wherein the operation of the sensor block in the first mode comprises a plurality of non-sensing periods of the sensor monitoring period and the operation of the sensor block in the second mode comprises a plurality of sensor scans during a plurality of sensing periods of the sensor monitoring period, the sensing block configured to receive a plurality of trigger signals and responsive to each trigger signal transition from operation in the first mode to operation in the second mode, the transition comprising enabling sensing circuitry, wherein responsive to a first sensor scan of a first sensing period, the sensor block to transition from operation in the second mode to operation in the first mode, the transition comprising disabling the sensing circuitry; and a processor, wherein responsive to a second scan during a second sensing period the processor to transition from operation in a first processing mode to operation in a second processing mode.

17. The integrated circuit of claim 16, wherein the sensing block is disposed on a first integrated circuit chip and the processor is disposed on a second integrated circuit chip.

18. The integrated circuit of claim 16, wherein the sensing block further comprises wake logic coupled to the sensing circuitry, the wake logic to cause the processor to transition to the operation in the second processing mode responsive to detection of a conductive object by the sensing circuitry.

19. The integrated circuit of claim 16, further comprising:
an oscillator configured to generate a clock signal, wherein a frequency of at least one excitation signal for each sensor scan is based on a frequency of the clock signal; and timer circuit configured to generate the plurality of trigger signals.

20. The integrated circuit of claim 19, wherein the timer circuit is coupled to the oscillator, wherein the timer circuit is configured to generate the plurality of trigger signals based on the clock signal generated by the oscillator.

* * * * *